United States Patent
Roettger et al.

(10) Patent No.: US 10,189,142 B2
(45) Date of Patent: Jan. 29, 2019

(54) METHOD FOR POLISHING A SEMICONDUCTOR WAFER

(71) Applicant: Siltronic AG, Munich (DE)

(72) Inventors: Klaus Roettger, Bachmehring (DE); Alexander Heilmaier, Haiming (DE); Leszek Mistur, Burghausen (DE); Makoto Tabata, Kakamigahara (JP); Vladimir Dutschke, Lengefeld (DE); Torsten Olbrich, Dresden (DE)

(73) Assignee: SILTRONIC AG, Munich (DE)

( * ) Notice: Subject to any disclaimer, the term of this patent is extended or adjusted under 35 U.S.C. 154(b) by 617 days.

(21) Appl. No.: 14/093,082

(22) Filed: Nov. 29, 2013

(65) Prior Publication Data

US 2014/0206261 A1 Jul. 24, 2014

(30) Foreign Application Priority Data

Dec. 4, 2012 (DE) .................. 10 2012 222 211
Feb. 1, 2013 (DE) .................. 10 2013 201 663

(51) Int. Cl.
*B24B 37/08* (2012.01)
*B24B 37/24* (2012.01)
(Continued)

(52) U.S. Cl.
CPC .............. *B24B 37/08* (2013.01); *B24B 37/24* (2013.01); *H01L 21/02024* (2013.01); *H01L 21/304* (2013.01)

(58) Field of Classification Search
CPC ....... B24B 7/228; B24B 7/241; B24B 53/095; B24B 53/02; B24B 53/017; B24B 55/02;
(Continued)

(56) References Cited

U.S. PATENT DOCUMENTS 3,691,694 A 9/1972 Goetz et al.
4,739,589 A 4/1988 Brehm et al.
(Continued)

FOREIGN PATENT DOCUMENTS

CN 1441713 A 9/2003
CN 101047144 A 10/2007
(Continued)

OTHER PUBLICATIONS

Xin, Y.B., "Modeling of pad-wafer contact pressure distribution in chemical mechanical polishing", International Journal for Manufacturing Science and Technology, 1998, vol. 1 No. 2, pp. 20-34.

*Primary Examiner* — Monica Carter
*Assistant Examiner* — Marcel Dion
(74) *Attorney, Agent, or Firm* — Leydig, Voit & Mayer, Ltd.

(57) ABSTRACT

A method for polishing at least one wafer composed of semiconductor material that has a front side and the rear side includes performing at least one first polishing step including simultaneously polishing both front and rear sides of the at least one wafer at a process temperature between an upper polishing plate and a lower polishing plate. Each of the upper polishing and lower polishing plates is covered with a polishing pad having an inner edge and an outer edge, a hardness of at least 80° Shore A, a compressibility of less than 2.5%, and respective upper and lower surfaces that come into contact with the wafer being polished. The upper and lower surfaces form a polishing gap extending from the inner edge to the outer edge. A height of the polishing gap at the inner edge differs linearly from the height of the polishing gap at the outer edge.

19 Claims, 4 Drawing Sheets

(51) Int. Cl.
  *H01L 21/02* (2006.01)
  *H01L 21/304* (2006.01)
(58) Field of Classification Search
  CPC ....... B24B 37/022; B24B 37/08; B24B 37/17;
              B24B 37/28; B24B 37/14; B24B 37/16;
              B24B 37/24; B24B 37/26
  USPC ................ 451/41, 53, 56, 57, 261, 268, 269
  See application file for complete search history.

(56) References Cited

U.S. PATENT DOCUMENTS

| | | | |
|---|---|---|---|
| 5,510,175 | A | 4/1996 | Shiozawa |
| 5,779,526 | A * | 7/1998 | Gill ...................... B24B 53/017 451/242 |
| 5,958,794 | A | 9/1999 | Bruxvoort et al. |
| 6,093,085 | A | 7/2000 | Yellitz et al. |
| 6,116,997 | A | 9/2000 | Hakomori et al. |
| 6,682,405 | B2 | 1/2004 | Shimokawa |
| 6,758,939 | B2 | 7/2004 | Marquardt et al. |
| 7,101,275 | B2 * | 9/2006 | Roberts .................. B24B 37/22 451/533 |
| 7,364,495 | B2 * | 4/2008 | Tominaga ............... B24B 37/08 257/E21.23 |
| 7,470,169 | B2 | 12/2008 | Taniguchi et al. |
| 7,892,861 | B2 | 2/2011 | Ecarnot et al. |
| 8,113,913 | B2 | 2/2012 | Pietsch et al. |
| 2001/0014570 | A1 | 8/2001 | Wenski et al. |
| 2003/0224604 | A1 | 12/2003 | Cho |
| 2005/0227590 | A1 | 10/2005 | Sung |
| 2005/0255794 | A1 * | 11/2005 | Vangsness ............ B24B 37/205 451/36 |
| 2008/0038989 | A1 * | 2/2008 | Boller ...................... B24B 7/17 451/5 |
| 2008/0070483 | A1 | 3/2008 | Roettger et al. |
| 2008/0102741 | A1 | 5/2008 | Shih et al. |
| 2008/0233840 | A1 * | 9/2008 | Pietsch .................. B24B 37/08 451/41 |
| 2008/0293343 | A1 * | 11/2008 | Wang .................... B24B 37/046 451/508 |
| 2009/0042487 | A1 * | 2/2009 | Tokura ................... B24B 49/16 451/41 |
| 2010/0035520 | A1 * | 2/2010 | Tanaka ................... B24B 49/02 451/8 |
| 2011/0189505 | A1 * | 8/2011 | Ono ........................ B24B 37/12 428/846.9 |
| 2011/0189506 | A1 * | 8/2011 | Mannami ............. C10M 133/00 428/846.9 |
| 2011/0223841 | A1 | 9/2011 | Schwandner et al. |
| 2012/0028547 | A1 | 2/2012 | Tsai |
| 2012/0164919 | A1 * | 6/2012 | Kanzow ................ B24B 37/042 451/9 |
| 2012/0189777 | A1 * | 7/2012 | Pietsch .................. B24B 37/08 427/359 |
| 2014/0235143 | A1 * | 8/2014 | Staudhammer ....... B24B 53/017 451/56 |
| 2014/0308878 | A1 * | 10/2014 | Baumann ................ B24B 37/08 451/41 |

FOREIGN PATENT DOCUMENTS

| | | | | |
|---|---|---|---|---|
| CN | 101148025 | A | 3/2008 | |
| CN | 101359595 | A | 2/2009 | |
| DE | 10007390 | A1 | 10/2000 | |
| DE | 10004578 | C1 | 7/2001 | |
| DE | 102007056628 | A1 | 9/2008 | |
| DE | 102008056276 | A1 | 5/2010 | |
| DE | 102010024040 | A1 * | 12/2011 | ............. B24B 37/08 |
| EP | 0208315 | A1 | 1/1987 | |
| EP | 1852899 | A1 | 11/2007 | |
| EP | 2266757 | A1 | 12/2010 | |
| EP | 2345505 | A2 | 7/2011 | |
| JP | 2002166357 | A | 6/2002 | |
| JP | 2006344892 | A | 12/2006 | |
| JP | 2007021604 | A | 2/2007 | |
| JP | 2012150865 | A | 8/2012 | |
| TW | 201131635 | A | 9/2011 | |

\* cited by examiner

METHOD FOR POLISHING A SEMICONDUCTOR WAFER

CROSS REFERENCE TO RELATED APPLICATIONS

This application claims priority from German Patent Application No. DE 10 2012 222 211.1, filed on Dec. 4, 2012 and German Patent Application No. DE 10 2013 201 663.8, filed on Feb. 1, 2013, which are hereby incorporated by reference herein in its entirety.

FIELD

The invention relates to a method for polishing at least one wafer composed of semiconductor material (semiconductor wafer), comprising at least one simultaneous double-side polishing step using thin polishing pads having low compressibility.

BACKGROUND

Wafers composed of semiconductor material (semiconductor wafers), as substrates for particularly demanding components such as those, for example, having a minimum structural length of $\leq 22$ nm, that is to say 22 nm design rule according to ITRS ("International Technology Roadmap for Semiconductors"), have to be particularly flat.

In accordance with the prior art, the wafers sawn from a single crystal of semiconductor material are planarized in various work steps.

mechanical wafer processing (lapping, grinding),
chemical wafer processing (alkaline or acidic etch),
chemomechanical wafer processing: single-side polishing (SSP), double-side polishing (DSP), single-side haze-free or mirror polishing using a soft polishing pad (chemical mechanical polishing, CMP).

The mechanical processing of the semiconductor wafers serves primarily for the global leveling of the semiconductor wafer, furthermore for the thickness calibration of the semiconductor wafers, and also for the removal of the crystalline-damaged surface layer and processing traces (sawing grooves, incision mark) caused by the preceding separation process.

In the case of etching, contaminants and/or native oxides are removed chemically from the surface of the semiconductor wafers.

Final smoothing of the surfaces of the semiconductor wafer is finally effected by means of chemical mechanical polishing.

In the case of single-side polishing (SSP), semiconductor wafers are held during processing on the rear side on a support plate by means of wax, by vacuum or by means of adhesion and are subjected to polishing on the other side.

A suitable single-side polishing machine is disclosed in the document U.S. Pat. No. 6,116,997 A, for example.

In the case of traditional double-side polishing (DSP), semiconductor wafers are inserted loosely into suitably dimensioned cutouts in a thin carrier plate and are polished on the front and rear sides simultaneously in a "freely floating" manner between an upper and a lower polishing plate each covered with a polishing pad.

This polishing method is effected with the supply of a polishing agent slurry usually based on a silica sol. In the case of DSP, the front and rear sides of the semiconductor wafer are simultaneously polished at the same time.

A suitable double-side polishing machine is disclosed in the application DE 100 07 390 A1, for example.

A corresponding DSP method is described in the patent specification U.S. Pat. No. 3,691,694, for example.

In accordance with an embodiment of DSP as described in the patent specification EP208315B1, semiconductor wafers in carrier plates composed of metal or plastic, which have suitably dimensioned cutouts, are moved between two rotating polishing plates covered with a polishing pad in the presence of a polishing agent on a path predetermined by the machine and process parameters and are thereby polished (the term "carrier plates" is employed in the literature).

The DSP is usually carried out using a polishing pad composed of homogeneous, porous polymer foam, as described in the document DE10004578C1, for example.

Different polishing pads each having specific properties can be used depending on the polishing process to be carried out and the respectively desired material removal from the surface or surfaces of the semiconductor wafer.

Polishing pads can consist of a thermoplastic or thermosetting polymer. As material for these pads, referred to as foamed polishing pads (foamed pads), a multiplicity of materials come into consideration, e.g. polyurethanes, polycarbonate, polyamide, polyacrylate, polyester, etc. A polishing pad produced from a polymer is disclosed in US 2008/0102741 A1, for example.

However, polishing pads can also consist of foamed plates or felt or fibrous substrates impregnated with polymers (non-woven pad). Such a pad is described in U.S. Pat. No. 5,510,175 A, for example.

In principle, it possible to differentiate between, for example, polishing pads which contain no bonded abrasives in their surface and those which contain bonded abrasives. These polishing pads are designated as fixed abrasive pads (FA pads).

Polishing pads which contain no bonded abrasives are disclosed in the European patent application EP 2 266 757 A1, for example.

Polishing pads which contain bonded abrasives are disclosed in the application US 2005 0 227 590 A1, for example. U.S. Pat. No. 5,958,794 teaches a method for the treatment of a substrate surface composed of semiconductor material using a pad which contains bonded abrasives.

A further differentiating feature of polishing pads is the hardness of the respective polishing pad, for example. Harder polishing pads are less compressible than softer polishing pads, but have the disadvantage that during polishing damage can occur in the polished surface of the semiconductor wafer since loose particles cannot press into the pad.

Conditioning (refreshing) of the polishing pad used for the polishing of semiconductor wafers becomes necessary if, for example, the geometry of the polishing pad surface has changed or too many solids have been incorporated on the surface of the polishing pad (glazing). As a result of the incorporated solids, there is a lasting change in the polishing pad properties, and so firstly the specific polishing removal rate is adversely influenced and secondly a non-uniform polishing removal can take place.

The double-side polishing methods known in the prior art have the disadvantage that generally the amount of material removed is higher in the edge region of the wafer composed of semiconductor material than in the other regions of the wafer (edge roll-off, ERO) and thus lead to a poor edge geometry.

The severity of the edge roll-off depends, inter alia, on how far the wafer sinks in the polishing pad and the edge is thereby rounded. The prior art describes various measures for reducing or avoiding the edge roll-off during the polishing process.

Xin reports the use of harder polishing pads for improving the flatness of silicon wafers (Xin, Y. B. 1998, Modeling of Pad-wafer contact pressure distribution in chemical mechanical polishing, International Journal for Manufacturing Science and Technology, v.1, n.2, pp.20-34). This study shows that the pressure on the edge region of a wafer composed of semiconductor material is higher approximately by a factor of 1.5 in the case of a very soft pad than in the case of a very hard pad.

The document EP 2 345 505 A2 teaches the adaptation of the surface shape of a polishing pad by corresponding dressing in such a way that the semiconductor wafer has the desired surface shape after the polishing process.

The American patent U.S. Pat. No. 7,364,495 B2 teaches a device and a method for simultaneously polishing the front side and the rear side of a semiconductor wafer, wherein the desired surface shape of the semiconductor wafer is achieved during polishing by means of slight alterations (μm range) of the polishing plate geometry. According to U.S. Pat. No. 7,364,495 B2, the polishing plate geometry can be obtained for example by changing the polishing plate temperature, but also mechanically by means of corresponding pressure units.

The application US 2003/0224604 A1 describes a method for avoiding edge roll-off by using a sacrificial ring which encloses the semiconductor wafer during polishing and thus protects the edge region of the wafer against increased material removal, since the circumference of the semiconductor wafer is extended. In this case, the ring produced from silicon or ceramic has the thickness of the semiconductor wafer to be polished.

What is disadvantageous about the method described in the published patent application US 2003/0224604 A1 is, inter alia, that the edge of the semiconductor wafer can be damaged by the surrounding ring by the forces occurring during the polishing process.

The European patent application EP 1 852 899 A1 describes a method for avoiding edge roll-off wherein, after double-side polishing of a semiconductor wafer, one or both sides of the semiconductor wafers is/are protected with a resin film before edge polishing is carried out. The protection film is subsequently removed again using an aqueous alkaline solution, for example.

Other methods for avoiding edge roll-off during the polishing of a semiconductor wafer are directed to the use of specific polishing pads and/or the dressing of the polishing pad.

By way of example, the published European patent application EP 2 345 505 A2 describes a method for dressing a polishing pad, wherein the profile of a polishing pad bearing on a polishing plate is measured and the polishing parameters for obtaining the desired surface properties of the semiconductor wafer are selected on the basis of this measurement. In addition, the surface of the measured polishing pad can also be modified by a corresponding dressing process.

The U.S. Pat. No. 6,682,405 B2 teaches methods for dressing a polishing pad using a ring-shaped tool whose surface that comes into contact with the polishing pad surface, contrary to the prior art, is inclined toward the polishing pad surface, as a result of which a constant pressure is obtained during the polishing pad dressing.

The published German patent application DE 10 2008 056 276 A1 teaches a method for regulating the working gap of a double-side polishing machine. Said working gap, in which the substrate to be polished is situated, is formed by an upper and a lower polishing plate each covered with a polishing pad (working surface). At least one polishing plate can be deformed by an adjusting device, such that the shape of the working gap changes and the working surfaces have a maximum parallelism. Material removal that is as uniform as possible is intended to be ensured by the regulation of the working gap geometry.

Furthermore, DE 10 2008 056 276 A1 discloses regulating the working gap in such a way that, for example, a specific concavity or convexity of one or both polishing plates is obtained, wherein the working gap can have a different height on one side than on the other side.

The method for regulating the working gap of a double-side polishing machine as taught in the published patent application DE 10 2008 056 276 A1 presupposes corresponding technical devices that are not always available. Furthermore, edge roll-off cannot always be avoided even with absolute parallelism of the polishing plates, since said edge roll-off is not just influenced by the parallelism of the polishing plates.

SUMMARY

In an embodiment, the present invention provides a method for polishing at least one wafer composed of semiconductor material that has a front side and the rear side includes performing at least one first polishing step including simultaneously polishing both front and rear sides of the at least one wafer at a process temperature between an upper polishing plate and a lower polishing plate. Each of the upper polishing plate and lower polishing plate is covered with a polishing pad having an inner edge and an outer edge, a hardness of at least 80° Shore A, a compressibility of less than 2.5%, and respective upper and lower surfaces that come into contact with the wafer being polished. The upper and lower surfaces form a polishing gap extending from the inner edge of the polishing pad to the outer edge of the polishing pad. A height of the polishing gap at the inner edge differs linearly from the height of the polishing gap at the outer edge.

DETAILED BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings.

DETAILED DESCRIPTION

Figure 1A:
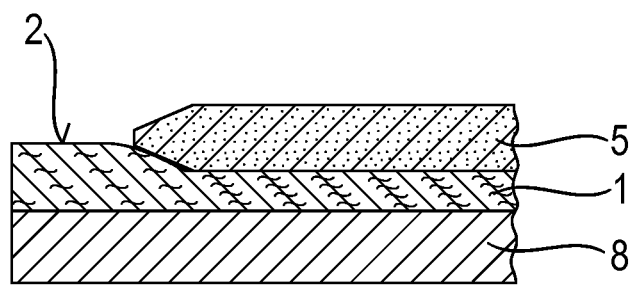
FIG. 1a shows an the use of a soft and compressible pad in a polishing method.

In an embodiment, the present invention provides an improved method for simultaneous double-side polishing which can be employed without specific technical prerequisites of the double-side polishing machine and at the same time prevents edge roll-off In an embodiment, the present invention provides a method for polishing at least one wafer (5) composed of semiconductor material having a front side and the rear side, comprising at least one first polishing step by means of which the wafer (5) composed of semiconductor material is polished at a process temperature simultaneously on both sides on the front side and on the rear side between an upper and a lower polishing plate (8), which are each covered with a hard polishing pad (1) having low compressibility, and the distance between the upper and the lower surface (2)—which comes into contact with the substrate to be polished—of the polishing pads (1) forms a polishing gap, and this polishing gap extends from the inner edge (B) of the polishing pad (1) as far as the outer edge (A) of the polishing pad (1), wherein the pad surface (2) is processed by a first dressing in such a way that the height of the polishing gap at the inner edge (B) differs from the height of the polishing gap at the outer edge (A).

The embodiments mentioned below serve for elucidation, without restricting the scope of the method to these embodiments.

With the method according to the invention for simultaneous double-side polishing of at least one wafer composed of semiconductor material, edge rounding can be significantly reduced or even avoided by means of a combination of hard polishing pads having low compressibility with a specific shape of the working gap, realized by means of suitable thickness profiles of the polishing pads.

Figure 1B:
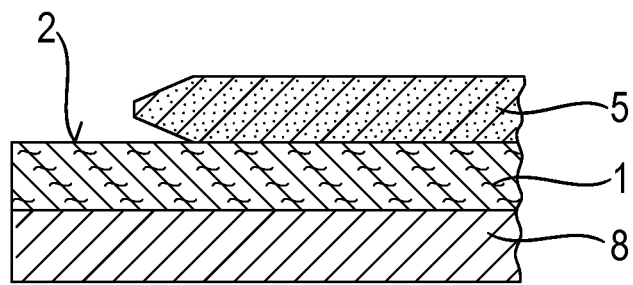
FIG. 1b shows an embodiment of the claimed method using a polishing pad having higher hardness and lower compressibility, and being adhesively bonded onto a polishing plate.

FIGS. 1a and 1b show the influence of the hardness and the compressibility of a polishing pad on the edge of a wafer composed of semiconductor material.

FIG. 1a: In the case of a soft and compressible pad (1), adhesively bonded onto a polishing plate (8), the wafer (5) sinks somewhat into the working surface (2) of the polishing pad (1). As a result, higher forces act on the wafer (5) in the edge region of the wafer than in other regions of the wafer (5), such that the edge is rounded by increased material removal during polishing.

FIG. 1b: In the case of the method according to the invention for simultaneously polishing the front side and the rear side of a wafer (5) composed of semiconductor material using a polishing pad (1) having higher hardness and lower compressibility, which polishing pad is adhesively bonded onto a polishing plate (8), the wafer (5) does not sink into the working surface (2) of the polishing pad (1).

FIGS. 2a, 2b, 2c and 2d show the pad thickness profiles of an upper and a lower polishing pad (1) before and after dressing.

Figure 2A:
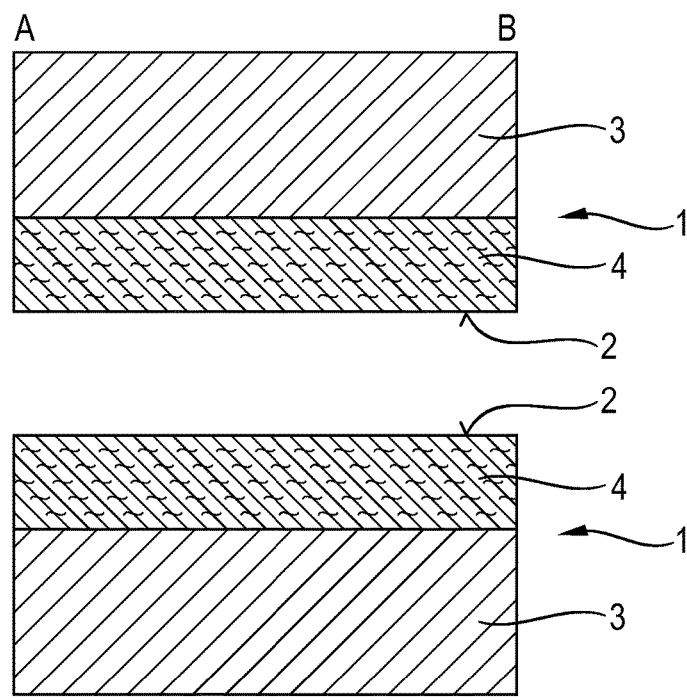
FIG. 2a shows a polishing pad before the first dressing.

FIG. 2a: Before the first dressing, each polishing pad (1) is characterized by a plane-parallel front side (working surface) (2) and rear side (3) with a thickness of the working layer (4) of 800 to 900 µm, for example.

Figure 2B:
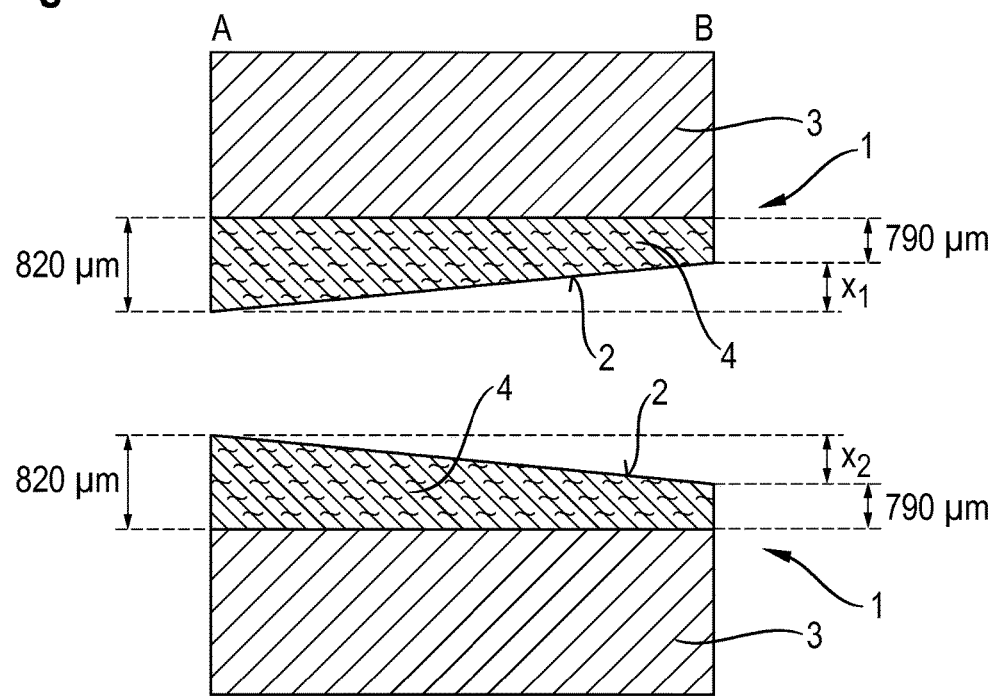
FIG. 2b shows a polishing pad after the first dressing.

FIG. 2b: After dressing, the thickness of the working layer (4) at the outer edge (A) of the pad (1) is 820 µm, for example, whereas at the inner edge (B) the thickness of the working layer (4) is 790 µm, for example. A V-shaped working or polishing gap arises as a result.

Figure 2C:
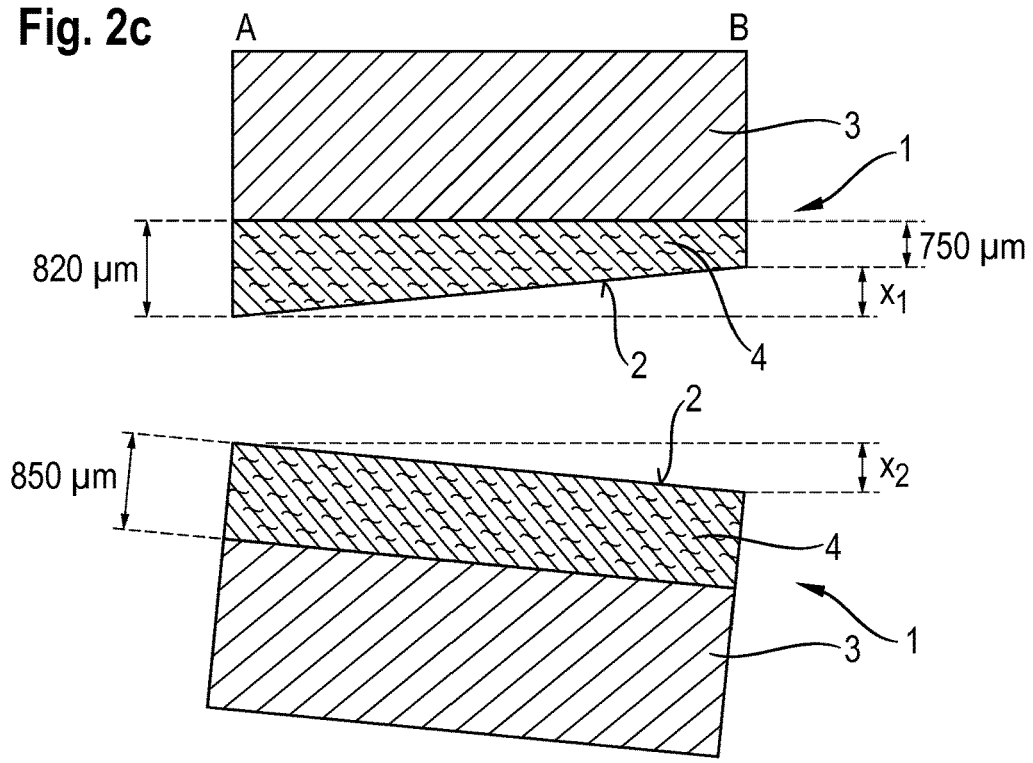
FIG. 2c shows upper and lower polishing pads being dressed differently.

FIG. 2c: The upper and lower polishing pads (1) were dressed differently in this example. While the working layer (4) of the upper polishing pad (1) is thicker (820 µm) at the outer edge (A) than at the inner edge (B) (750 µm), the working layer (4) of the lower polishing pad (1) has the same thickness (850 µm in the example) between the outer edge (A) and the inner edge (B). In addition, the lower polishing plate (not depicted) is deformed for example in such a way that the V-shaped polishing gap is manifested to a greater extent.

Figure 2D:
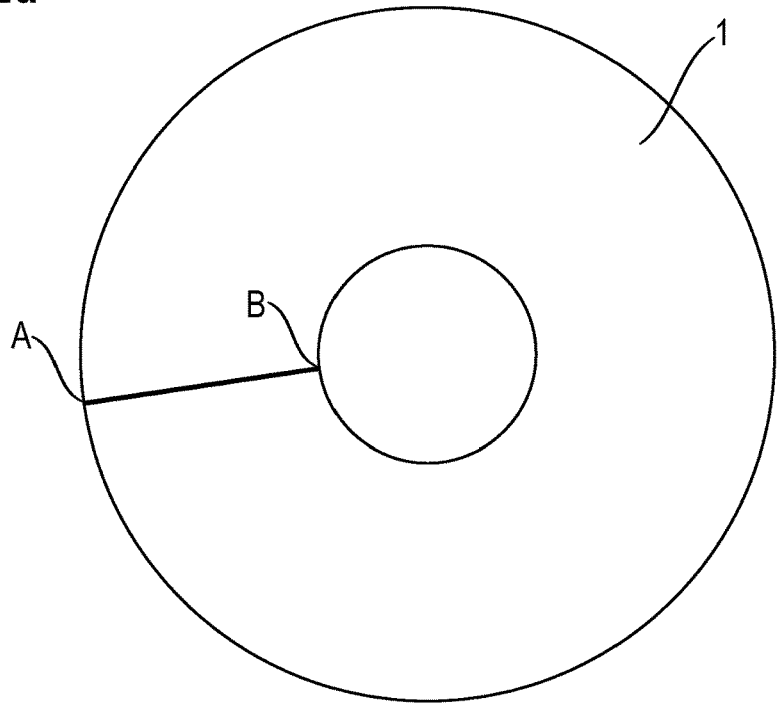
FIG. 2d shows a ring-shaped polishing pad in plan view and the position of the edge points (A) and (B)

FIG. 2d shows a ring-shaped polishing pad (1) in plan view and the position of the points (A) (edge) and (B) (center). The connection between (A) and (B) corresponds to the profiles of the pad surface as shown in FIGS. 2a and 2b.

Figure 3A:
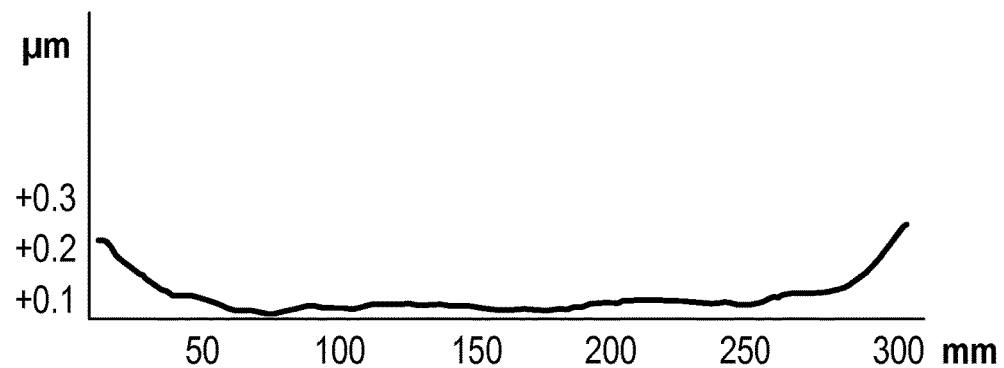
FIG. 3a shows a thickness profile function of a polished silicon wafer with a hard polishing pad having low compressibility in double-side polishing performed in a plane-parallel polishing gap.
Figure 3B:
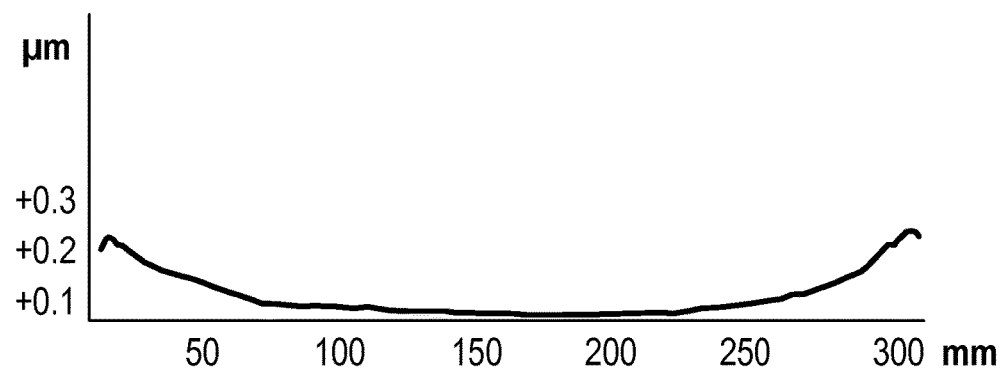
FIG. 3b shows a thickness profile function of a polished silicon wafer with a hard polishing pad having low compressibility in double-side polishing performed in a V-shaped polishing gap.

FIGS. 3a and 3b show two different thickness profiles (surface geometries) of polished wafers composed of semiconductor material having a diameter of 300 mm as a function of the shape of the polishing gap. The global thickness profile of a polished semiconductor wafer from one side to the other is plotted. The preferred wafer is thicker at the edge than at the inner area and thus has a concave shape.

The GBIR (Global Flatness Back Ideal Range (GBIR)) is the difference between the largest and smallest thickness differences, a GBIR that is as low as possible being desired.

The SFQR (Site Flatness Front Least Squares Site Range) describes the change in thickness of the semiconductor wafer relative to the front side of the semiconductor wafer as reference plane within a small site, for example having a respective size of 26×8 mm. Consequently, the SFQR describes rather local changes in thickness, e.g. an edge roll-off FIG. 3a shows a thickness profile of a polished silicon wafer with a hard polishing pad having low compressibility, in the case of which the double-side polishing was performed in a plane-parallel polishing gap. This results in a pot-shaped semiconductor wafer having a very poor SFQR value (26×8 EE 2 mm) of 50 nm.

FIG. 3b shows a thickness profile of a polished silicon wafer with a hard polishing pad having low compressibility, in the case of which the double-side polishing was performed in a V-shaped polishing gap according to the invention, wherein the polishing gap was narrower at the outer area than at the inner area. The resulting advantageous shape of the semiconductor wafer is characterized by a small GBIR of less than 0.2 µm, a small SFQR value (26×8 EE 22 mm) of 16 nm and a low edge roll-off.

The invention relates to the simultaneous polishing of the front side and the rear side (DSP) of at least one wafer composed of semiconductor material (semiconductor wafer), wherein semiconductor materials are compound semiconductors such as, for example, gallium arsenide or elemental semiconductors such as principally silicon, but also germanium, or else layer structures thereof.

Polishing pads for the simultaneous polishing of the front side and rear side of at least one wafer composed of semiconductor material are ring-shaped in accordance with the prior art, wherein a circular cutout for the polishing machine mechanisms is situated in the center of the polishing pad surface (FIG. 2c).

The method according to the invention for simultaneously polishing the front side and the rear side of a semiconductor wafer using polishing pads having a high pad hardness and a low pad compressibility is suitable for all wafer diameters.

Further polishing steps or other processes for processing the surfaces of the at least one wafer composed of semiconductor material may follow after the method according to the invention.

During the simultaneous polishing of the front side and the rear side (DSP) of a wafer composed of semiconductor material, an undesired rounding of the wafer edge (Edge Roll-Off, ERO) generally occurs. This rounding, which leads to a poor edge geometry, is dependent, inter alia, on how far the wafer sinks into the upper polishing pad, the lower polishing pad or into both polishing pads during polishing. As a result of the wafer composed of semiconductor material sinking into the polishing pad, material-removing forces acting on the edge are higher than those acting on the rest of the surface.

In order that sinking of the wafer (5) composed of semiconductor material into the polishing pad (1) during polishing is minimized or completely avoided, polishing pads (1) having a high pad hardness (hard polishing pad) and a low pad compressibility are used in the method according to the invention for simultaneously polishing the front side and the rear side of at least one wafer (5) composed of semiconductor material (FIG. 1b).

In connection with this invention, a hard polishing pad has a hardness according to Shore A of at least 80°.

In connection with this invention, a polishing pad having a low compressibility has a compressibility of less than 3%. The compressibility of a material describes what pressure change on all sides is necessary to bring about a specific change in volume. The compressibility is calculated analogously to JIS L-1096 (Testing Methods for Woven Fabrics).

After a defined pressure, for example 300 g/cm2, has been applied to the pad surface, the pad thickness T1 is measured after one minute. Afterward, the pressure is increased to six times the first pressure, here 1800 g/cm2, and the pad thickness T2 is measured after one minute. From the values T1 and T2, the compressibility of the polishing pad is calculated using the formula compressibility [%]=(T1−T2)/T1×100.

Since, preferably, the upper and lower polishing plates in the method according to the invention are each covered with a polishing pad (1) having the same properties with regard to hardness and compressibility for the method according to the invention, only one polishing pad (1) and its preferred properties will be discussed hereinafter. Independently of these properties, the geometry of the surface (working surface (2)) of the upper and lower polishing pads (1) can be different.

Both foamed polishing pads (foamed pads) and polishing pads having a fibrous structure (non-woven pads) are suitable for the method according to the invention for simultaneously polishing the front side and the rear side of a semiconductor wafer using polishing pads (1) having a high pad hardness and a low pad compressibility.

Preferably, the polishing pad (1) or the working surface (2) thereof consists of a thermoplastic or thermosetting polymer and has a porous matrix (foamed pad). As material, a multiplicity of materials come into consideration, e.g. polyurethanes, polycarbonate, polyamide, polyacrylate, polyester, etc.

Preferably, the polishing pad (1) or the working surface (2) thereof consists of solid microporous polyurethane.

Preference is also given to the use of polishing pads composed of foamed plates or felt or fibrous substrates impregnated with polymers (non-woven pad).

The use of hard or very hard polishing pads (1) is preferred.

The use of a polishing pad (1) having a hardness of 80-100° according to Shore A is particularly preferred.

One suitable, commercially available polishing pad is, for example, the SUBA™ 1200 from Rohm & Haas having a hardness of 84° according to Shore A.

Pads of the MH-S24A type from Nitta Haas Inc. are specified for example with a hardness of up to 86 JIS-A (JIS K 6253A), wherein a hardness according to JIS-A corresponds to a hardness according to Shore A.

The use of polishing pads (1) having a low or very low compressibility is preferred.

Preferably, the compressibility of the polishing pad (1) is less than 2.5%.

Particularly preferably, the compressibility of the polishing pad (1) is less than 2.2%.

Especially preferably, the compressibility of the polishing pad (1) is less than 2.0%.

The low compressibility of the polishing pad (1) is obtained by using thin polishing pads (1). In the method according to the invention, the thickness of the polishing pad (1) is preferably in the range of 0.5 to 1.0 mm, particularly preferably in the range of 0.5 to 0.8 mm.

The thinner polishing pads (1) in comparison with the prior art are produced, in the case of foamed pads, by cutting corresponding thicknesses from a block (cake) consisting of the polishing pad material, and are procured from the manufacturer.

Non-woven pads are procured in the corresponding thickness from the manufacturer.

The polishing pads (1) for the method according to the invention for simultaneously polishing the front side and the rear side of at least one wafer (5) composed of semiconductor material using hard polishing pads (1) having low compressibility have to be adhesively bonded onto the respective polishing plate (8) of the polishing machine absolutely uniformly, that is to say without air bubbles or folds, for example.

For this purpose, in the method according to the invention the polishing pad (1) has on its rear side (3) an adhesive film applied by machine. By way of example, the double-sided adhesive film PSA from 3M is suitable for the adhesive film.

In order that the polishing pad (1) can be adhesively bonded onto the polishing plate (8) absolutely uniformly, the polishing plate (8) is heated by means of an internal temperature control. The polishing plate (8) is preferably heated to 40-50° C., particularly preferably to 45-50° C. The heating of the polishing plate (8) reduces the viscosity of the adhesive film whilst at the same time improving the adhesiveness of the adhesive film.

The hardness of a polishing pad is influenced by the temperature during polishing. The hardness of the polishing pad decreases as the temperature increases.

Therefore, after the polishing pad (1) has been adhesively bonded, the temperature of the polishing plate is reduced to the process temperature desired for the method according to the invention. In order, during the cooling of the polishing plate (8) covered with the polishing pad (1) to the desired process temperature, to avoid formation of bubbles or folds in the adhesively bonded polishing pad (1), such formation being possible as a result of the temperature-dependent deformation of the polishing plate (8), the polishing plate (8) is cooled slowly to the desired process temperature. That takes place by means of a corresponding formula that regulates the internal temperature control of the polishing plate (8).

Preferably, the cooling of the polishing plate (8) covered with the polishing pad (1) from the temperature set for adhesive bonding to the desired process temperature takes place over a period of at least three hours, wherein, during the entire cooling process, the polishing pad is pressed against the respectively opposite polishing plate (8) with a pressure of at least 1 N/cm2.

A cooling duration of 4 to 8 hours is particularly preferred.

The decrease in temperature can take place linearly, in an exponentially falling manner or in a stepped manner over the cooling time.

Since a polishing plate may usually have differences in the local flatness of up to ±50 µm, the polishing pad (1) adhesively bonded onto the polishing plate must be adapted to the respective individual plate shape of the polishing machine before the polishing process. This adaptation, the first pad dressing, and the requisite methods therefore are prior art and described for example in the documents EP 2 345 505 A2 or U.S. Pat. No. 6,682,405 B2.

The pad dressing or dressing is the mechanical processing (dressing method) of the polishing pad situated on the polishing plate by means of suitable tools, which generally comprise diamond abrasive bodies. The purpose of the dressing is to set both a desired polishing pad geometry, and hence a desired polishing gap geometry, and the desired properties of the pad surface (working surface) of the polishing pad. The polishing pad situated on the polishing plate is in each case optimized in relation to a specific polishing machine and a polishing gap.

For the method according to the invention for simultaneously polishing the front side and the rear side of a wafer (5) composed of semiconductor material using hard polishing pads (1) having low compressibility, the first pad dressing takes place after the polishing pads (1) have been adhesively bonded onto the upper and the lower polishing plate (8) before the first polishing pass.

Preferably, for the first pad dressing, the respective polishing plate (8) is hydraulically/pneumatically deformed, as is made possible for example by the DSP machine AC 1500-P3 from Peter Wolters GmbH. The method for deforming the polishing plate is described in the German application DE 10 2008 056 276 A1.

Likewise preferably, for the first pad dressing, the respective polishing plate is deformed in a temperature-controlled manner. For this purpose, the polishing plate (8) with the polishing pad adhesively bonded thereon is heated to 50° C., for example, or the first dressing takes place before the polishing plate (8) is slowly cooled.

The desired geometry and the properties of the working surface (2) of the polishing pad (1) are set by the first dressing.

For the first pad dressing, preferably 20-100 µm, particularly preferably 30-60 µm, are removed from the working layer (4) of the polishing pad (1) in such a way that the individual flatness profile of the respective polishing plate is compensated for and a polishing gap having the desired geometry is available.

The geometry of the polishing gap in the method according to the invention for simultaneously polishing the front side and the rear side of at least one wafer (5) composed of semiconductor material results from the difference in the distance (height) between the surfaces (2) of the upper and the lower polishing pad (1) at the inner edge (B) of the working gap and the distance between the surfaces (2) of the upper and the lower polishing pad (1) at the outer edge (A) of the working gap.

A V-shaped geometry of the polishing gap is preferred, wherein the polishing gap either is smaller at the inner edge (B) than at the outer edge (A), or vice versa.

Particularly preferably, the height of the polishing gap, that is to say the respective distance between the upper and lower polishing pads, is smaller at the outer edge (A) than at the inner edge (B).

The different heights in the polishing gap are obtained in the method according to the invention by virtue of different thicknesses of the polishing pad (1) at the outer area (A) and inner area (B) of the pad and result from a corresponding pad dressing.

In order to achieve the desired geometry of the polishing gap by means of the pad dressing, for example by means of a higher removal of the working layer (4) of the polishing pad (1) at the inner edge (B) than at the outer edge (A), the upper polishing plate of the DSP machine is deformed in such a way that in the working gap more pressure during dressing arises at the inner edge (B) than at the outer edge.

The lower polishing plate preferably remains unchanged during the dressing, that is to say that it is not deformed in a specific direction. Likewise preferably, the lower plate is additionally deformed.

In this example, a dressed polishing pad (1) results which has a working layer having a thickness gradient in which the working layer (4) is thicker at the outer edge (A) than at the inner edge (B), such that during polishing at the outer edge (A), as a result of the narrower polishing gap in comparison with the inner edge (B), a polishing pressure acting on the edge of the wafer composed of semiconductor material to be polished is higher than that acting in the center of the wafer.

Preferably, the thickness of the working layer (4) at the outer edge (A) of the polishing pad (1) after dressing is greater than that at the inner edge (B) of the pad (FIG. 2b). The respectively desired thickness gradient, that is to say the difference in pad thickness along the section AB (FIG. 2d), and hence the thickness of the working layer (4) from the inner edge (B) to the outer edge (A), is adapted to the respective requirements of the simultaneous double-side polishing of at least one wafer (5) composed of semiconductor material.

The thickness gradient can be designed to be linear and nonlinear (convex or concave).

A linear thickness gradient is preferably set between the inner edge (B) and the outer edge (A) of the working gap (FIG. 2b).

For the method according to the invention for simultaneously polishing the front side and the rear side of at least one wafer (5) composed of semiconductor material using hard polishing pads (1) having low compressibility, the thickness gradient of the working layer (4) of the upper pad (1) can be different than in the case of the lower pad (1) (FIG. 2c), wherein a V-shaped polishing gap can for example additionally be realized by the deformation of a polishing plate. A height gradient of the polishing gap results from the respective thickness gradients of the working layers (4) of the upper and the lower polishing pad (1).

The desired geometry of the polishing gap can be set by the four individual contributions of the working layer of the upper polishing pad, the working layer of the lower polishing pad, the deformation of the upper polishing plate and/or the deformation of the lower polishing plate. In this case, preference is given to either the application of an individual contribution or the combination of at least two individual contributions for setting the desired geometry of the polishing gap, for example a V-shaped polishing gap.

The magnitude of the height gradient is primarily dependent on the size of the polishing plates. In this case, the ring width of the polishing pads, that is to say the distance between the inner and outer edges of the polishing pads, is crucial.

Preferably, the difference in the height of the polishing gap between the inner and outer edges is 70 μm to 360 μm relative to one meter ring width of the polishing pads, particularly preferably 110 μm to 220 μm relative to one meter ring width of the polishing pads.

For the method according to the invention for simultaneously polishing the front side and the rear side of at least one wafer (5) composed of semiconductor material using hard polishing pads (1) having low compressibility with, for example, a ring width of 0.7 meter, the height difference of the polishing gap between the inner and outer edges of the polishing pad is preferably between 50 and 250 μm, particularly preferably between 80 and 150 μm, wherein the height difference of the polishing gap results from the sum of the differences x1 and x2 at the edge which, as a result of the dressing, is thinner in comparison with the opposite edge of the polishing pad (1) (FIG. 2b and FIG. 2c).

The result of the dressing or the pad/plate profile is preferably monitored by means of pressure strain gauges and pad thickness and working gap measurement in accordance with the prior art.

With the aid of the pressure strain gauges, the pressure distribution, between two touching surfaces, can be represented in color if the latter are pressed together with a specific force. The different pressure distributions become visible from the different color densities. A higher color density indicates a region with higher pressure, and a lower color density indicates a region with lower pressure.

The pressure strain gauge is used to determine the pressure distribution in a radial direction between the two polishing plates of a DSP installation. For this purpose, the pressure strain gauge is placed radially onto the lower polishing plate or the lower polishing pad. The two plate halves are subsequently moved together in such a way that the force acting between the plates is analogous to the polishing process.

Preferably, for the method according to the invention a profile of the polishing gap is set in the case of which during the polishing process somewhat more pressure acts on the substrate at the outer area (at the edge (A) of the polishing pad (1)) than at the inner area (at the inner edge (B) of the polishing pad (1)).

This preferred pressure profile is preferably achieved thereby that the thickness of the working layer (4) of at least one of the two (FIG. 2c), preferably both polishing pads (1) (FIG. 2b) being somewhat lower at the inner edge (B) than at the outer edge (A) (outwardly increasing thickness gradient of the working layer thickness (4) or outwardly decreasing height gradient of the polishing gap).

By way of example, the thickness of the working layers (4) of the upper and lower polishing pads after the first dressing can be 820 μm at the outer edge (A) and 790 μm at the inner edge (B) (FIG. 2b).

The thickness of the working layers (4) of the upper and lower polishing pads can also have different thickness gradients. By way of example, the thickness of the working layer (4) of the upper polishing pad after the first dressing can be 820 μm at the outer edge (A) and 750 μm at the inner edge (B), and the thickness of the working layer (4) of the lower polishing pad after the first dressing can be 820 μm at the outer edge (A) and 790 μm at the inner edge (B).

This pressure profile is likewise preferably obtained by means of a correspondingly adapted shape (geometry) of the polishing plates (8). In this embodiment of the method according to the invention for simultaneously polishing the front side and the rear side of a wafer (5) composed of semiconductor material using hard polishing pads (1) having low compressibility, the desired polishing gap geometry, for example an outwardly decreasing height gradient of the polishing gap, is obtained by means of the corresponding shape of the upper and lower polishing plates (8) each covered with a polishing pad (1).

In this case, the thickness of one or both polishing pads (1) can have no or an additional thickness gradient in order, for example, optimally to adapt the profile of the respective polishing plate (8) to the desired geometry of the polishing gap or to compensate for properties (geometries) of different polishing installations.

The method according to the invention for simultaneously polishing the front side and the rear side of a wafer (5) composed of semiconductor material, with the use of foamed polishing pads, is carried out preferably at a process temperature of 10° C.-50° C., particularly preferably at a process temperature of 15° C.-35° C., especially preferably at a process temperature of 18° C.-30° C.

With the use of non-woven polishing pads, the preferred process temperature is 35° C. to 50° C.

For the method according to the invention, the at least one wafer (5) composed of semiconductor material is placed into the at least one suitably dimensioned cutout in a carrier plate.

The thickness of the carrier plate used is dependent on the respective double-side polishing method. If the at least one wafer (5) composed of semiconductor material is polished with a positive jutout, the carrier plate used is somewhat thinner, for example 2 to 3 μm, than the target thickness of the wafer (5) composed of semiconductor material that is to be attained after the double-side polishing.

If the at least one wafer (5) composed of semiconductor material is polished with a negative jutout, the carrier plate used is somewhat thicker, for example 2 to 3 μm, than the target thickness of the wafer (5) composed of semiconductor material that is to be attained after the double-side polishing.

Preferably, the rate of material removal on the front and rear sides of the at least one wafer (5) composed of semiconductor material is identical.

A different material removal on the front and rear sides of the at least one wafer (5) composed of semiconductor material is likewise preferred.

Preferably, a liquid is fed into the working gap formed between the working layers (4) during processing.

Said liquid is preferably a polishing agent slurry.

Preferably, the polishing agent slurry used contains abrasives selected from one or more oxides of the elements aluminum, cerium and silicon.

The size distribution of the abrasive material particles is preferably markedly monomodal.

In the case of the monomodal distribution of the abrasive material particles, the average particle size is 5 to 300 nm, particularly preferably 5 to 50 nm.

The proportion of the abrasive material in the polishing agent slurry is preferably 0.1 to 20% by weight, particularly preferably 0.1 to 3% by weight.

The use of colloidally disperse silica as polishing agent slurry is particularly preferred.

By way of example, the aqueous polishing agents Levasil® 200 from Bayer AG and Mazin SR330 from Dupont Air Products can be used.

The polishing agent slurry can contain additives such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH).

However, the polishing agent slurry can contain one or more further additives, for example surface-active additives such as wetting agents and surfactants, stabilizers acting as protective colloids, preservatives, biocides, alcohols and complexing agents.

During the simultaneous polishing of the front side and the rear side of at least one wafer (5) composed of semiconductor material using hard polishing pads (1) having low compressibility, a surface removal of less than or equal to 15 μm per side is preferably effected, the range of 5 μm to 12 μm being particularly preferred in this regard.

In the method according to the invention, a longer usability of the polishing pads (1) results since the method according to the invention enables a very precise setting (geometry) of the polishing gap, that is to say of the corresponding pad thicknesses between center and edge of the polishing plate.

This results in a significantly increased economic viability of the method according to the invention compared with DSP processes in accordance with the prior art.

Wafers (5) composed of semiconductor material which are polished by the method according to the invention have a better geometry, in particular with regard to global and local flatness, and a significantly reduced edge roll-off (FIG. 3).

The second and further pad dressings are effected according to the invention in such a way that the desired geometry of the polishing gap is maintained.

For the second and further pad dressings, preferably 5-100 μm, particularly preferably 10-40 μm, are removed from the working surface (2) of the polishing pad (1). The second and further pad dressings are carried out by means of the same method as the first pad dressing.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for polishing at least one wafer including a semiconductor material, having a front side and the rear side, the method comprising:
    simultaneously polishing both front and rear sides of the at least one wafer at a process temperature between an upper polishing plate and a lower polishing plate,
    wherein the lower polishing plate is covered with a lower polishing pad,
    wherein the upper polishing plate is covered with an upper polishing pad,
    wherein the polishing pads each have an inner edge and an outer edge,
    wherein the polishing pads each have a hardness of at least 80° Shore A,
    wherein the polishing pads each have a compressibility of less than 2.5%,
    wherein respective upper and lower surfaces of the lower and upper polishing pads come into contact with the wafer being polished,
    wherein the upper and lower surfaces form a polishing gap extending from the inner edge to the outer edge of each polishing pad, and
    wherein at least one of the polishing pads is configured such that a height of the polishing gap at the inner edge differs linearly from the height of the polishing gap at the outer edge due to a thickness gradient in a working layer of the upper or lower polishing pad at the inner edge relative to the outer edge.

2. The method as claimed in claim 1, wherein the difference in the height of the polishing gap between the inner and outer edges is in a range of from 70 μm to 360 μm relative to a one meter diametric ring width,
    wherein the ring width is defined as a radial distance between the inner edge and the outer edge of one of the polishing pads.

3. The method as claimed in claim 1, wherein the hardness of the upper and/or lower polishing pad is in a range of from 80° to 100° Shore A.

4. The method as claimed in claim 1, wherein the thickness of the upper and/or lower polishing pad is in a range of from 0.5 to 1.0 mm.

5. The method as claimed in claim 1, wherein each polishing pad is adhesively bonded onto the respective polishing plate.

6. The method as claimed in claim 5, further comprising:
    adhesively bonding the polishing pads onto respective polishing plates; and
    heating each polishing plate in a range of from 40 to 50° C., thereby adhesively bonding the polishing pads to the respective polishing plates.

7. The method as claimed in claim 1, further comprising removing 20 to 100 μm from a working layer of the polishing pad.

8. The method as claimed in claim 1, wherein the height of the polishing gap decreases linearly from the inner edge to the outer edge.

9. The method as claimed in claim 1, wherein the process temperature is in a range of from 10° C. to 50° C.

10. The method as claimed in claim 1, wherein the process temperature is in a range of from 35° C. to 50° C.

11. The method as claimed in claim 1, wherein the hardness of the upper and lower polishing pads is in a range of from 80° to 100° Shore A.

12. The method as claimed in claim 1, wherein the thickness of the upper and lower polishing pads is in a range of from 0.5 to 1.0 mm.

13. The method as claimed in claim 1, wherein the compressibility of the polishing pads is less than 2.2%.

14. The method as claimed in claim 1, wherein the compressibility of the polishing pads is less than 2.0%.

15. The method as claimed in claim 1, wherein the polishing gap is V-shaped.

16. The method as claimed in claim 1, further comprising:
   removing 30 to 60 μm from the working layer of the polishing pad.

17. The method as claimed in claim 1, wherein, for a ring width of 0.7 meter, the height difference of the polishing gap between the inner and outer edges of the polishing pads is in a range of 50 to 250 μm.

18. The method as claimed in claim 2, wherein the difference in the height of the polishing gap between the inner and the outer edges is in the range of from 110 μm to 220 μm.

19. The method as claimed in claim 1, wherein the thickness of the upper and/or lower polishing pad is in a range of from 0.5 to 0.8 mm.

\* \* \* \* \*